United States Patent [19]
Killpatrick et al.

[11] Patent Number: 5,719,675
[45] Date of Patent: Feb. 17, 1998

[54] LASER GYRO LIFE PREDICTION

[75] Inventors: Joseph E. Killpatrick, Minneapolis; Keith R. Fritze, Minnetonka; Dale F. Berndt, Plymouth, all of Minn.

[73] Assignee: Honeywell Inc., Minneapolis, Minn.

[21] Appl. No.: 902,372

[22] Filed: Jun. 16, 1992

[51] Int. Cl.$^6$ .................. G01B 9/02; H01S 3/083
[52] U.S. Cl. ........................... 356/350; 372/94
[58] Field of Search .................. 356/350; 372/94; 364/200

[56] References Cited

U.S. PATENT DOCUMENTS 5,127,016  6/1992  Podgorski .................. 372/59

Primary Examiner—Stephen C. Buczinski
Attorney, Agent, or Firm—Albert K. Kau

[57] ABSTRACT

A laser gyro lifetime prediction method incorporates a memory model that stores a worst case performance parameter for a readout intensity, a laser intensity and a derived quantity known as volts per mode for a laser gyro. A microprocessor based life prediction method utilizes a predetermined failure criteria to judge a estimate of laser gyro life based on historic performance of laser gyro operating parameters. The prediction is based on a linear quadratic or higher order fit of lifetime data for critical temperatures. The performance data is stored in a memory model for each critical temperature and parameter. The laser gyro reports eminent failures to the inertial navigation system or a host controller. Routine scheduled maintenance of the laser gyro is enhanced by knowing its lifetime.

25 Claims, 10 Drawing Sheets

Fig.2    CALCULATING VOLTS/MODE

1

LASER GYRO LIFE PREDICTION

This patent relates to a method of predicting a laser gyro's lifetime and more particularly for a method of predicting when a laser gyro will fail based on a historic performance of laser life parameters such as laser intensity and volts per mode.

BACKGROUND OF THE INVENTION

It is highly desirable to know when the components of an inertial navigation system will fail. Life prediction is possible based on historic laser gyro performance data at particular temperatures. Lifetime prediction can be used to estimate when a device should be serviced for routine maintenance purposes. The ability to predict laser gyro lifetime allows laser gyro maintenance at highly desirable times such as nighttime or scheduled maintenance periods.

The capability of predicting lifetime is based on experimental and theoretical data showing that the output power of the laser gyro and a derived parameter, volts per mode is a function of both temperature and operating time. The longer a laser gyro is operational the lower the laser power output. Even though this power output diminishes slowly with time after a considerable life the laser power output decreases below what is considered an acceptable level of laser power output. The acceptable level of laser power output is determined when the laser gyro is manufactured. Furthermore, it is also known that the power output of a laser gyro will fluctuate within a given temperature range. Therefore, it is desirable to look at a minimum power for a particular time of aging and a particular temperature range.

As a result it is a motivation of the invention to provide a highly reliable method of determining when a laser gyro will fail based on historic performance data for certain laser gyro performance parameters.

SUMMARY OF THE INVENTION

The invention provides a lifetime prediction method for a laser gyro based on the measurement of certain gyro performance parameters. The parameters measured are laser intensity, readout intensity, volts per mode which is a derived quantity, and other gyro parameters. The performance parameters are monitored as a function of time over the lifetime of the laser gyro. The method fits the last 1000 hours of performance data to a predetermined linear, quadratic or higher order polynomial fit. When the laser gyro operates it can be polled to respond with its minimum estimated lifetime. The laser gyro warns the inertial navigation system using the laser gyro upon impending system failure. The method weights data to a particular laser gyro based on predetermined critical operating temperatures. The method of the invention creates a history of lifetime performance characteristics based on these critical temperatures. The laser gyro warns the inertial navigation system as it fails by sending different "levels of warning" depending on how much time is left in the estimated lifetime of the laser gyro.

It is an object of the invention to provide a laser gyro lifetime prediction method that anticipates the time at which the laser intensity monitor will drop below an acceptable level.

It is yet another object of the invention to provide a laser gyro lifetime prediction that provides a method of determining when the readout intensity monitor will drop below an acceptable level.

It is yet another object of the invention to provide a lifetime prediction method that utilizes the last 1000 hours of gyro lifetime performance data.

It is yet another object of the invention to provide a laser gyro lifetime prediction method that stores only the worst predicted lifetime for a particular time period and temperature.

It is yet another object of the invention to provide an ability to poll the laser gyro for its estimated life.

It is yet another object of the invention to provide a lifetime prediction method and apparatus that weights data to a particular laser gyro for predetermined temperature profiles.

It is yet another object of the invention to provide a laser gyro lifetime prediction method and apparatus that permits the planning of routine and system maintenance on an advantageous predetermined schedule.

DETAILED DESCRIPTION OF THE PREFERRED EMBODIMENT

Figure 1:
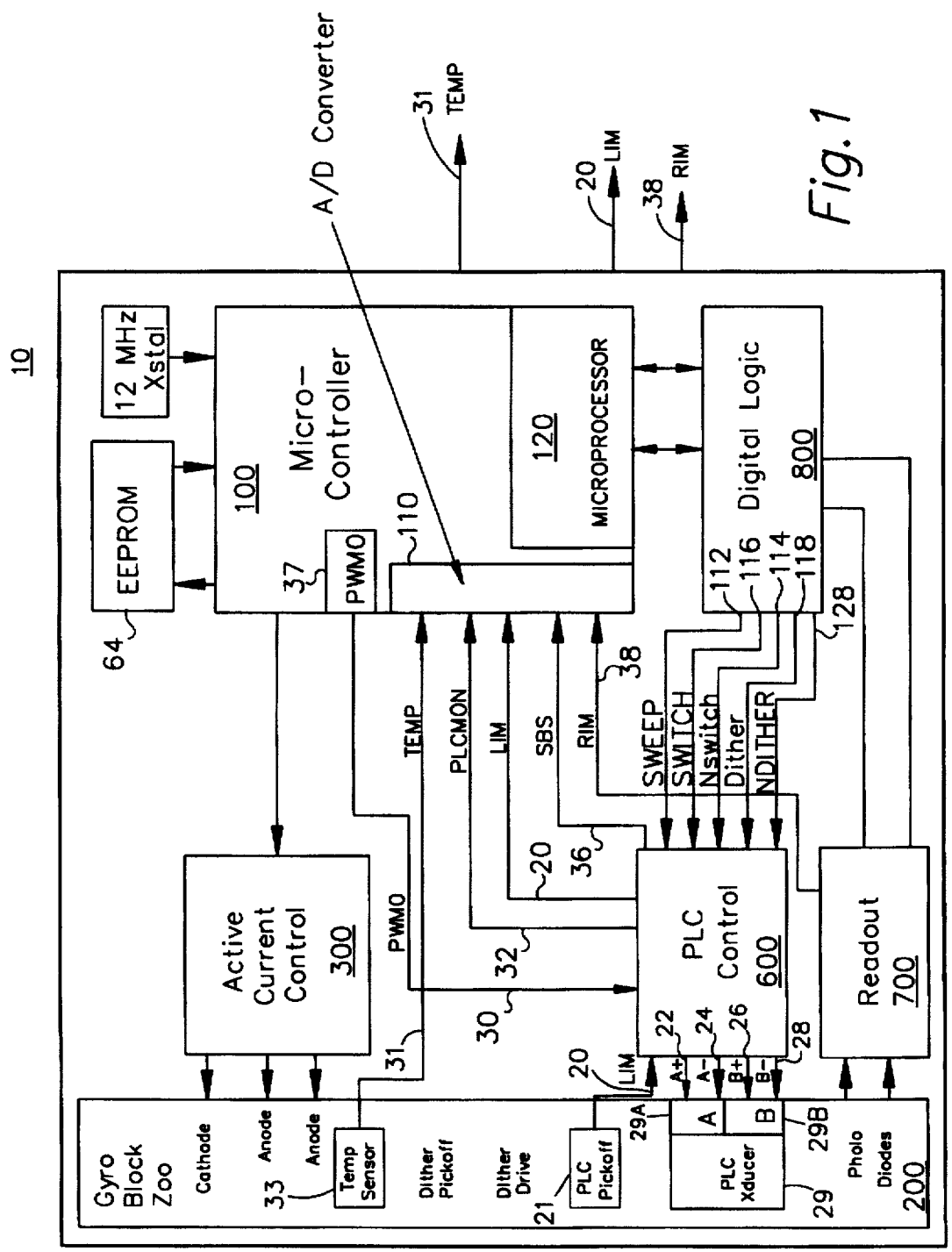
FIG. 1 shows the laser gyro of the method of the invention.

Referring now to FIG. 1 which shows a block diagram of one embodiment of a modular laser gyro employing the novel features of the present invention. The instant invention will be explained by way of example embodiments. Those skilled in the art having the benefit of this disclosure will appreciate that the examples herein are by way of illustration of the principles of the invention and not by way of limitation.

Laser gyro 10 includes a controller 100, a laser gyro block 200, an active current control 300, a path length control PLC apparatus 600, a photo diode readout system 700, and digital logic 800. The modular laser gyro apparatus of the invention is implemented in one example embodiment with a microcontroller serving as controller 100. The path length control system 600 of the instant invention forms a closed loop system comprising a laser intensity monitor LIM signal 20 and readout intensity monitor RIM signal 38 serving as the laser performance signals. The LIM signal 20 connect to the PLC apparatus 600 which provides a path length control monitor PLCMON signal 32, LIM signal 20, and single beam signal SBS 36 which is connected to the controller 100 through analog to digital converter 110. The PLC apparatus 600 is further described below with reference to FIGS. 4 and 5. Digital logic apparatus 800 provides a sweep signal 112, switch signal 116, not switch signal 114, dither signal 118 and not dither signal 128 to the path length control apparatus 600. The controller 100 provides control of the path length transducers through the digital logic apparatus 800. The A/D converter 110 may be integral to the controller 100 and may advantageously be a 10 bit A/D converter. The controller may also advantageously include a microprocessor 120. The operation of the invention is discussed in more detail below.

In one embodiment of the invention a controller 100 is comprised of the Intel 80C196KC Microcontroller. The controller 100 contains three pulse width modulators which in this embodiment of the invention are used for various control functions. The first pulse width modulator PWM0 37 is used for controlling the path length control apparatus 600 by PWM0 signal 30. A number of software modules are involved in the initialization and control of the controller 100. The software modules are run by the microprocessor 120 contained within the controller 100.

Figure 2:
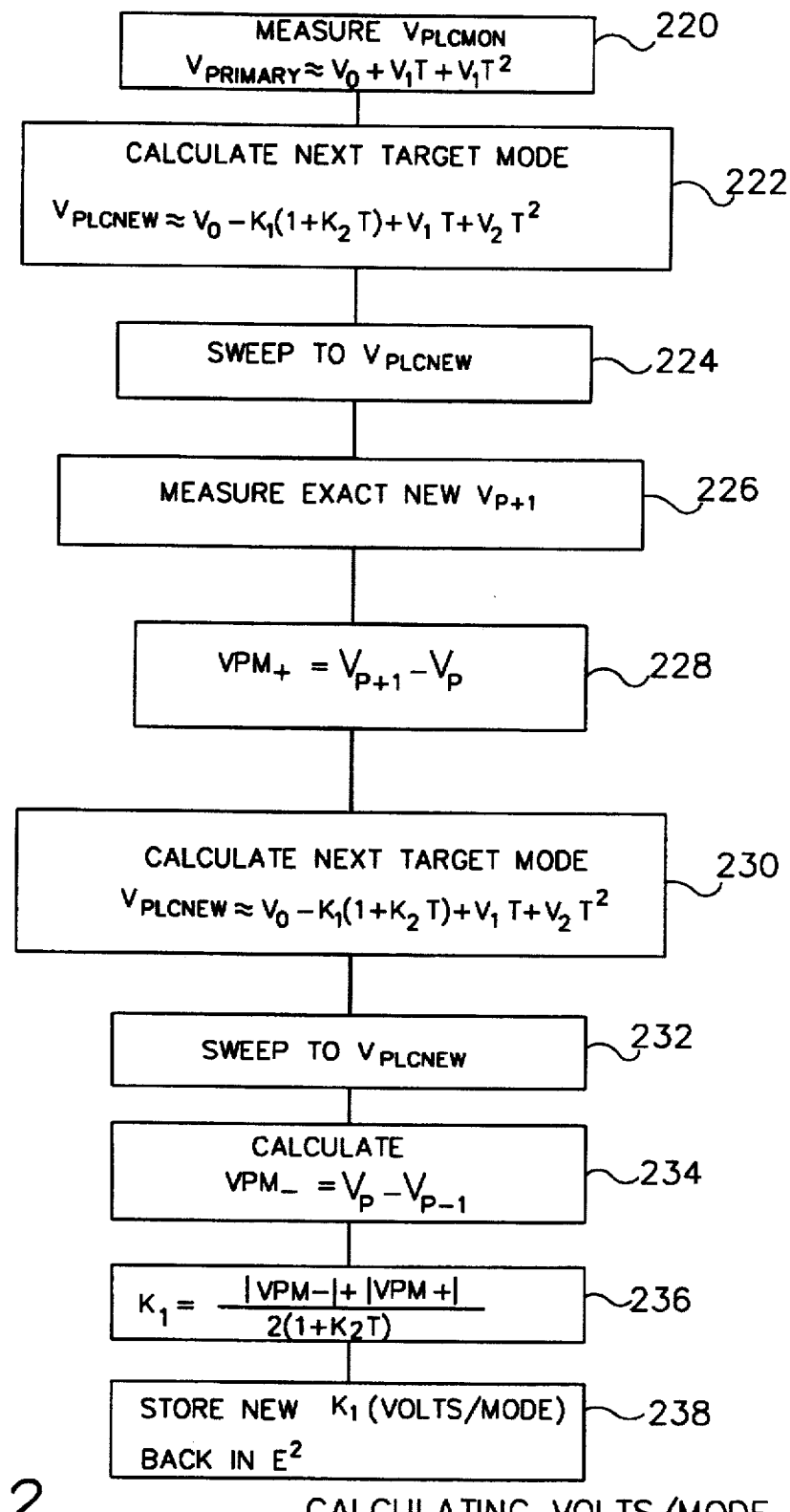
FIG. 2 shows the method of computing the derived parameter of volts per mode for the laser gyro.

Now referring to FIG. 2 which shows a flow diagram of the method of the invention used to calculate the volts per mode of the laser gyro which is a derived lifetime estimation parameter. The methods of acquiring a mode and sweeping the laser gyro path length controllers, two important functions for calculating volts per mode are described hereinbelow.

Figure 7:
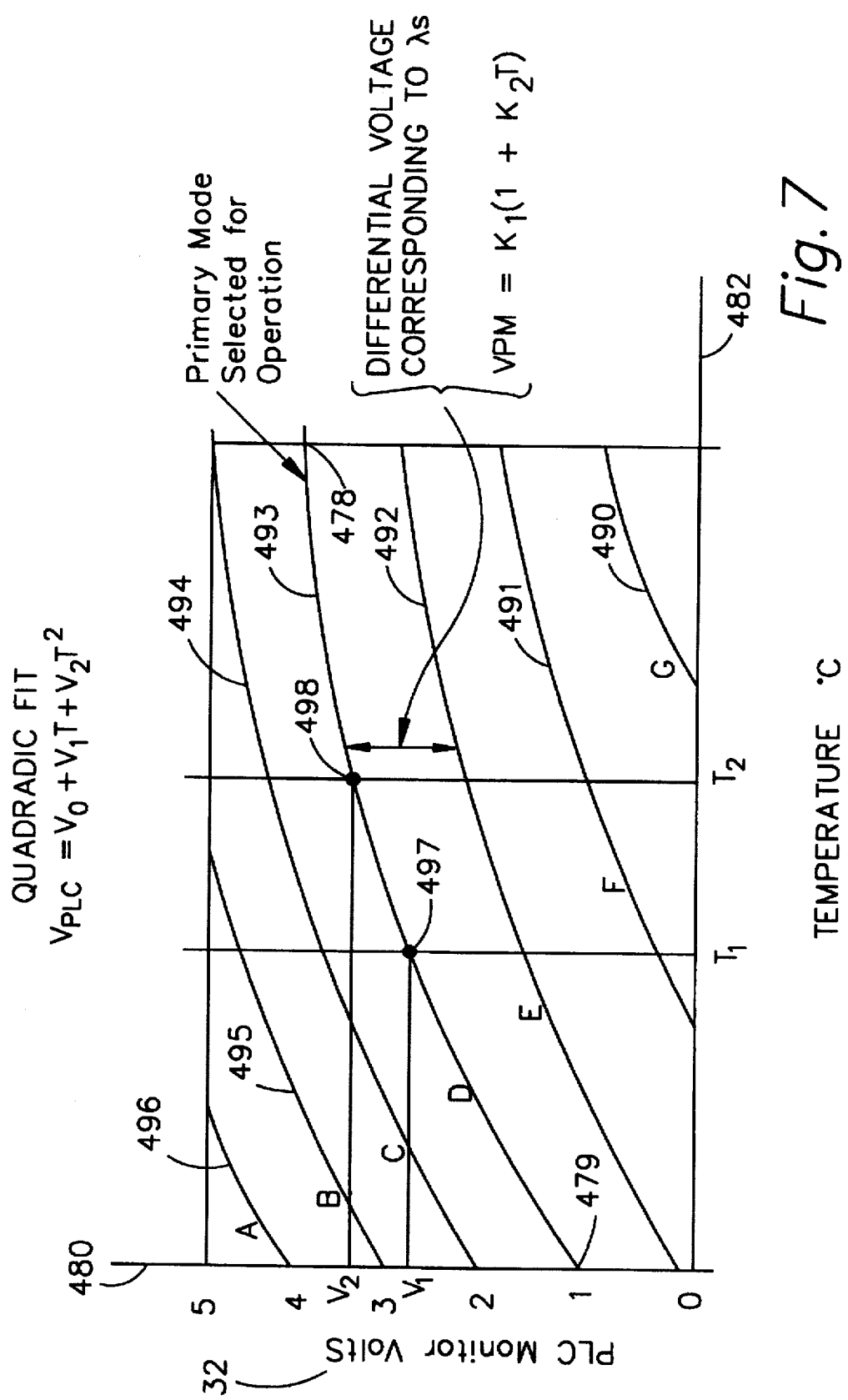
FIG. 7 shows seven modes of one example embodiment of the laser gyro of the invention.

Operating modes of the laser gyro 200 are dependent on temperature. Temperature fluctuations in gyro modes are illustrated in FIG. 7. FIG. 7 shows the behavior of path length control monitor voltage PLCMON 32 as it depends on temperature. A local peak, or maximum, in LIM is defined as a mode and is plotted as a parameter in terms of PLC monitor volts and as a function of temperature. Temperature is shown on the horizontal axis 482 which indicates increasing temperature to the right. PLC monitor voltage 32 is shown on the vertical axis 480 which indicates increasing PLC monitor output voltage toward the top of the graph.

FIG. 7 shows seven modes of one example embodiment of the laser gyro 10 of the invention as modes G through A numbered 490 through 496 respectively. FIG. 7 also shows two operating points of the laser gyro 497 and 498. It can be seen from FIG. 7 that as the temperature of the laser gyro changes so does the operating point of each mode. Lines 481 and 483 are provided to illustrate the effect of an increase in temperature from T1 to T2. Lines 481 and 483 intersect a number of mode curves providing several operating modes for the laser gyro at T1 and T2 respectively. Points 497 and 498 are provided to illustrate the effect a change in temperature has on the mode voltage. The laser gyro 10 is assumed to be operating on mode D, alternately known as the primary mode, at operating point 498.

While operating at T1 the path length control monitor voltage PLCMON 32 is shown in FIG. 7 to be V1 on axis 480. As the laser gyro changes temperature from T1 to T2 the PLCMON 32 voltage changes from V1 to V2 changing the operating point of the gyro to operating point 498 corresponding to PCLMON 32 voltage of V2. As the PLCMON 32 voltage swings through its minimum voltage 479 to its maximum voltage 478 the available modes at any given temperature changes such that not all modes are available at every temperature. Therefore a need may arise, as the temperature changes, to hop a mode.

Figure 8:
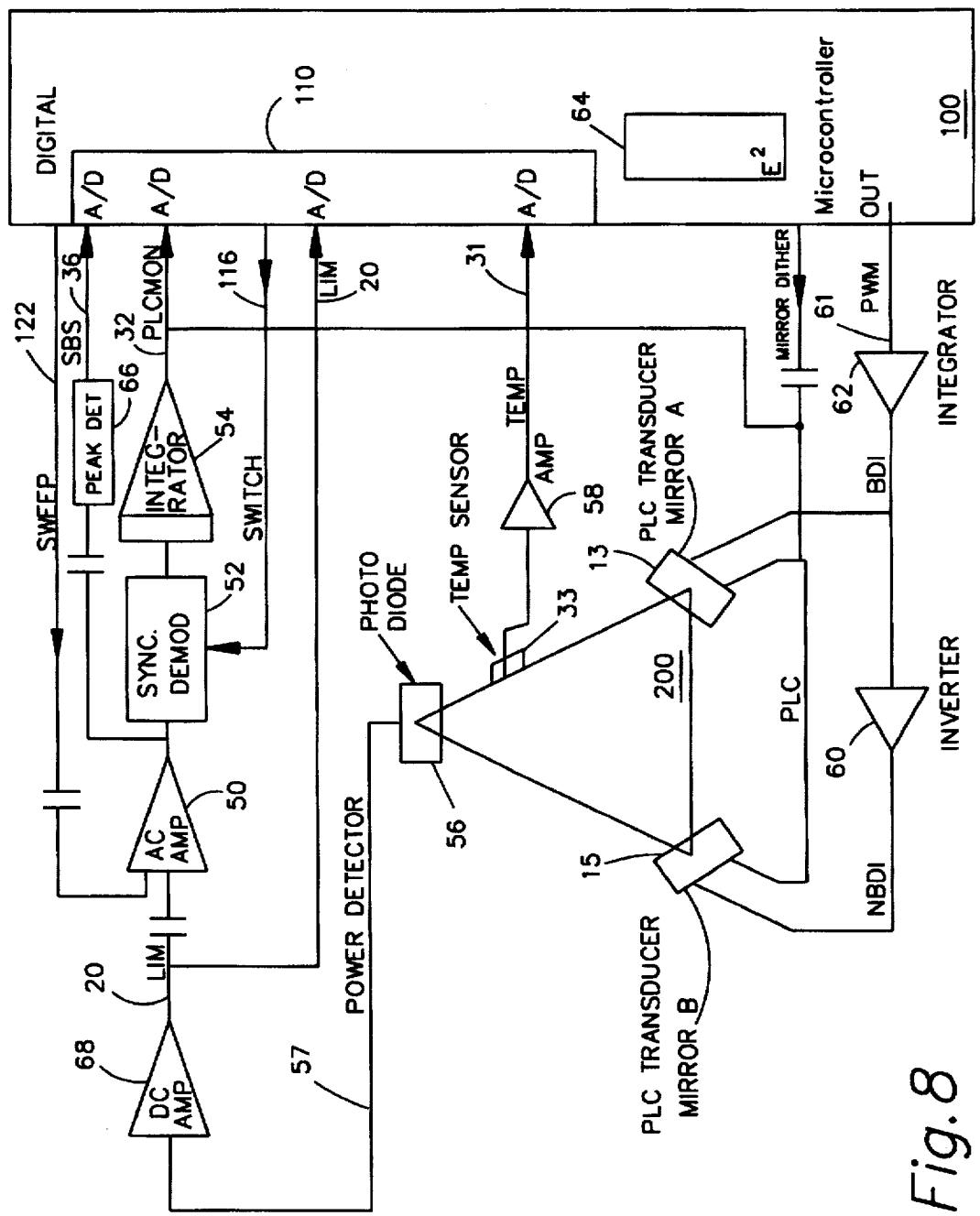
FIG. 8 shows one example of the apparatus of the invention to acquire a lasing mode and to hop lasing modes.

Now referring to FIG. 8 which shows the apparatus of the invention to acquire a lasing mode and to hop lasing modes. The apparatus of the invention controls the path length transducers for mirror A and mirror B of the laser block 200.

The laser block has a number of sensors including a temperature sensor 33 which sends a temperature signal which is amplified by temperature sensor amplifier 58 which provides a temperature signal 31 to the on board A/D converter 110. The temperature signal 31 is used by the microprocessor to perform mode acquisition and mode hopping functions which follow the curves of FIG. 7.

The laser block 200 also has a power detect signal 57 which is picked up from photo diode 56 connected to DC amplifier 68 which provides the laser intensity monitor (LIM) signal 20. The gyro block 200 transducer mirrors A and B provide the principle means by which path length control is achieved. As the laser path is adjusted with the path length control transducers the laser intensity monitor signal 20 will vary. The invention provides a number of components that help process the laser intensity monitor signal into a useful set of signals including the laser intensity monitor signal 20, a path length control monitor signal 32 and a single beam signal 36.

The AC amplifier 50 sees the AC component of the laser intensity monitor 20. The output of the AC amplifier 50 is sent to a synchronous demodulator 52 which provides a signal to an integrator 54 which generates the path length control monitor signal PLCMON 32. The output of the AC amplifier 50 is also AC coupled to a peak detector 66 which provides a single beam signal 36. The AC amplifier 50 also has as an input from the sweep signal 112 which is synchronized to the switch signal 116. The synchronous demodulator 52 also provides a method by which the closed loop path from the laser intensity monitor through to the path length control monitor can be used to adjust the path length.

The high level circuit diagram of FIG. 8 illustrates the method of the invention to control path length. The synchronous demodulator provides a way of controlling the path length mirrors in a fashion such that the path length control transducers are continuously looking for the peak of a laser mode.

Figure 9:
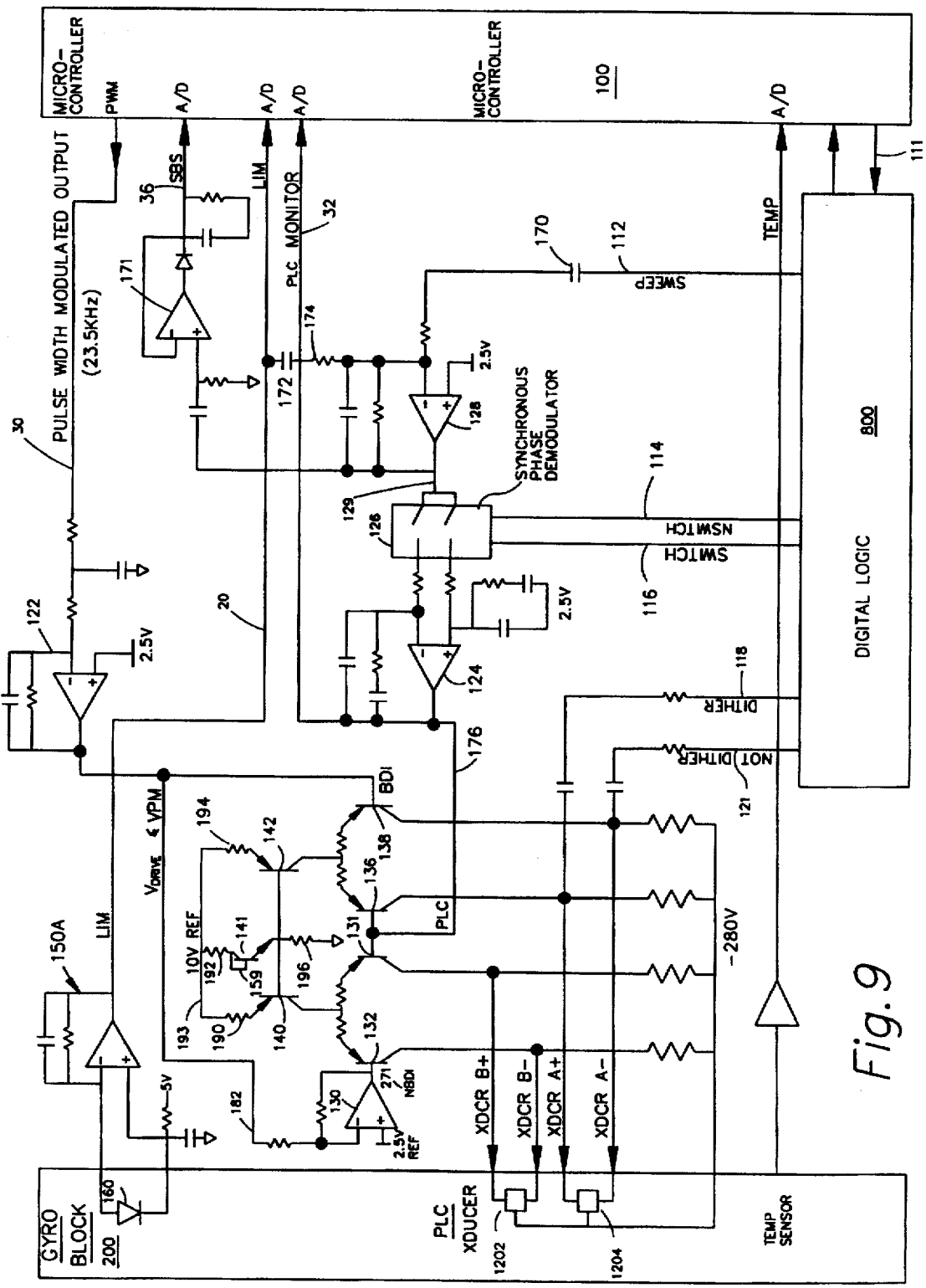
FIG. 9 shows one embodiment of a path length controller as employed in one example of the invention used to step through a number of modes of the laser.

Shown in FIG. 9 is one embodiment of a path length controller as employed in one example of the invention used to step through a number of modes of the laser. The path length controller of FIG. 9 comprises digital logic 800, the sweep signal 112, the not switch signal 114, the switch signal 116, the first dither signal 118, a second dither line 121, a first integrator 122, a second integrator 124, a synchronous phase demodulator switch 126, an amplifier 128 and inverter 130. Also included are a first set of driving transistors 136, 138 and a second set of driving transistors 131, 132.

The sweep line 112 supplies a 3 Khz signal during start up of the laser gyro 200. The sweep line 112 carries a signal designated SWEEP. The two switching lines 114, 116 also supply 3 Khz signals to the switch 126 wherein the first switching line 114 is 180° out of phase with the second switching line 116. The switching lines in one example are designated SWITCH (SW) and NOTSWITCH (NSW) respectively. Similarly, the dither lines 118,121 are designated DITHER (D) and NOTDITHER (ND) respectively. They also supply a 3 Khz signal from the digital logic 800 wherein the 3 Khz signals are 180° out of phase with each other. The dither lines and the switching lines are offset by 90 degrees in phase.

In operation the digital logic turns on the sweep line 112 in response to a start up command from the controller 100 on control line 111. At the same time the digital logic turns off the DITHER 118 and NOTDITHER 121 lines during the time the SWEEP signal is applied. When the gyro has swept to the desired laser mode, the SWEEP signal is removed and the DITHER and NOTDITHER lines 118, 121 are enabled. The sweep line 3 Khz signal is also related to the SWITCH and NOTSWITCH signals 116, 114. The sweep line 3 Khz signal will be in phase with one of the switch signals depending upon the mode to be swept, up or down. The 3 Khz SWEEP signal is connected through an AC coupling capacitor 170 to the inverting input of the first amplifier 128. The signal is then routed through switch 126 to the inverting or non-inverting input of the second integrator 124. In operation, if the SWEEP signal is in phase with the switch signal 116, the output of the inverter 128 will be routed through the non-inverting input of integrator 124. If the SWEEP signal is in phase with the NSW or NOTSWITCH signal line 114 the SWEEP signal will be routed through the inverting input of the second integrator 124. Those skilled in the art, having the benefit of this disclosure, will recognize that these relationships may be manipulated in various combinations to produce substantially similar results. The SWEEP signal is left on for a long enough period of time such that the output of the integrator at node 176 will achieve a high enough voltage for the modular gyro to sweep to a predetermined mode. Node 176, designated as a PLC Monitor signal, is monitored by the microprocessor controller 100 at A/D input 32.

Control line 111 provides control signals to the digital logic device 800 to substantially switch the operational mode of the path length controller from sweep to running mode. The computer algorithm used for acquiring a desired mode is explained further in detail below.

Also supplied to the controller 100 is the laser intensity monitor signal ("LIM") at A/D input 20. The laser intensity monitor signal is picked up from photo-detector 160 in the gyro block 200. The signal is amplified by transimpedance amplifier 150 and sent to the controller. The LIM signal 20 is AC coupled by capacitor 172 and fed back to the first amplifier 128 through the inverting input. Note that the RC circuit comprising capacitor 172 and resistor 174 are constructed as a high pass filter to allow the 3 Khz dithering signal to pass to the non-inverting input of amplifier 128. Therefore, in the sweep mode, that is usually on during start-up of the laser gyro, when the DITHER and NOT-DITHER lines 118 and 121 are turned off, any LIM signal components are blocked by capacitor 172 from appearing on the non-inverting input of amplifier 128.

The controller 100 continuously outputs a pulse width modulation signal PWM0 30 into the first integrator 122. This PWM0 signal is converted by integrator 122 into a path length control signal which is applied to the transistor drivers 132 and 138 in opposite polarities. The first component of the drive signal is applied to transistor 138. The second component 182 of the drive signal is applied through inverter 130 to transistor 132 to drive a second transducer in the gyro block. The PLC signal from the second integration amplifier 124 drives transistors 138 and 136 and the PLC signal together with the path length control signals operating in pairs to differentially drive two sets A and B of transducers in the gyro which are connected to two mirrors 13 and 15 in the gyro block shown in FIG. 1. In FIG. 9, the transducer drivers are shown as elements 1202 and 1204 by their representative capacitances. In practice, as is well known, these are typically piezoelectric elements. Piezoelectric transducers elements 1202 and 1204 have center taps that are connected to the most negative voltage −280 volts. In this way the piezoelectric elements never see a reverse voltage polarity which reduces hysteresis effects.

In one embodiment of the invention a constant current source comprising transistors 140 and 142 together with resistive components 190, 192,194 and 196 are arranged to provide a current of about 0.3 ma into each leg of the transducer differential driving transistor pairs (131, 132) are (136, 138). The synchronous phase demodulator continues to seek the peak LIM signal based on the phase of the amplified LIM signal 129.

Now referring again to FIG. 2, the process of calculating volts per mode starts by first measuring the path length control monitor voltage at step 220 $V_{PLCNEW}=V_0+V_1T+V_2T^2$. The process then flows to 222 where the target mode is calculated as $V_{PLCNEW}=V_0-K_1(1+K_2T)+V_1T+V_2T^2$. The process then steps to step 224 where the laser gyro is swept to the $V_{PLCNEW}$ voltage. The process steps to 226 where the voltages referred to in this method are defined as follows. $V_P$ is the voltage of the path length controller at the primary mode which. $V_{P+1}$ is the voltage of the path length control monitor at one mode higher than the primary mode. $V_{P-1}$ is the voltage of the path length control monitor at one mode lower than the primary mode. Process step 222 calculates the next higher target mode voltage as $V_{P+1}$. In step 226 the exact $V_{P+1}$ voltage is measured. In this volts per mode calculation a volts per mode for the laser gyro will be calculated for the positive direction and the negative direction. The positive volts per mode is called $VPM_+$ and the negative volts per mode is called $VPM_-$. The process then flows to step 228 where the voltage per mode in the positive direction is calculated as the voltage of the next higher mode to the primary mode $V_{P+1}$ minus the voltage of the primary mode $V_P$. The process then flows to 230 where the $V_{PLCNEW}$ voltage for the new voltage in the negative direction is calculated as $V_0-K_1(1+K_2T)+V_1T+V_2T^2$. The process of FIG. 2 then flows to process step 232 where the PLC transducers are swept to $V_{PLCNEW}$ following the method discussed hereinbelow.

The process then flows to process step 234 where the new volts per mode in the negative direction is calculated as the difference between the primary volts of the path length control monitor minus the new negative $V_{P-1}$. In process step 236 the new $K_1$ constant is computed as the absolute value of the negative volts per mode plus the absolute value of the positive volts per mode divided by two times the quantity $(1+K_2T)$. The process then flows to step 238 where the new $K_1$ (volts/mode) is stored in the $E^2PROM$ 64.

The volts/mode is one of many parameters that may be used to predict end of life as described below; RIM and LIM are others.

Figure 3:
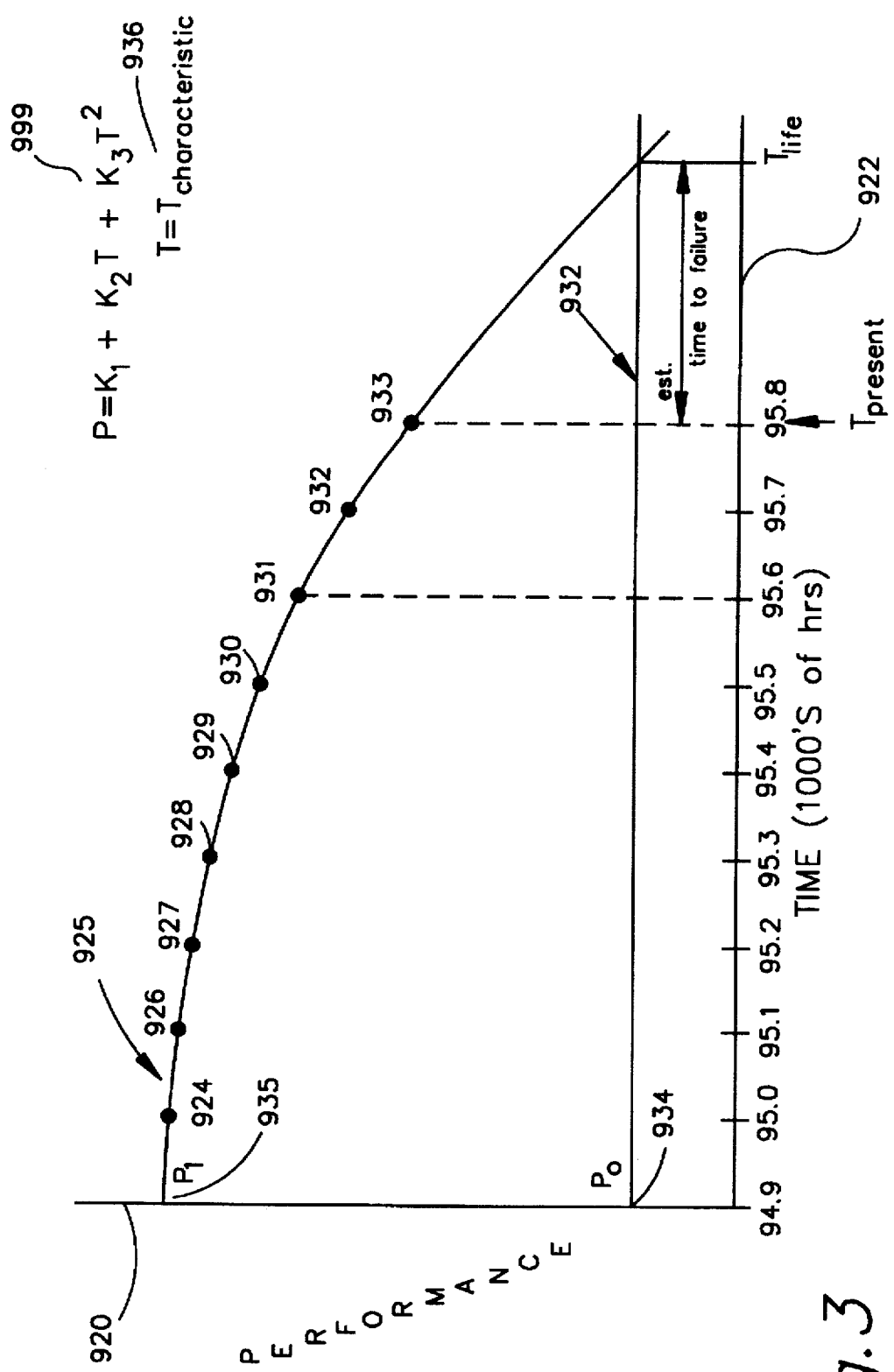
FIG. 3 shows the method of the invention's use of performance data over time as a graph of performance that is fit to a quadratic curve.

Referring now to FIG. 3, one example of laser gyro performance on axis 920 versus time on axis 922 is shown. The laser gyro of this example has certain sampled data at various data points. Data point 924 corresponds to 95,000 hours. Data point 926 corresponds to 95,100 hours. Data point 927 corresponds to laser gyro lifetime of 95,200 hours. Data point 928 corresponds to laser gyro lifetime of 95,300 hours. Data point 929 corresponds to a laser gyro lifetime of 95,400 hours. Data point 930 corresponds to a laser gyro lifetime of 95,500 hours. And finally data point 931 corresponds to laser gyro lifetime of 95,600 hours. FIG. 3 also shows the minimal acceptable performance level as line 934 which is a constant performance parameter corresponding to $P_0$ at data point 934 on axis 920. FIG. 3 shows a hypothetical aging profile from the last 1,000 hours of operation and showing an estimated time to failure of 1500 hours. It can be seen that the performance parameter P drops in magnitude from $P_1$ to $P_0$, $P_1$ shown at point 935, $P_0$ shown at 934. The point set 924–931 can be fit with any form of curve fitting method well known in the art. In the example of FIG. 3 it is shown as a quadratic equation 999. The performance parameter equals $K_1+K_2T+K_3T^2$ where $K_1$, $K_2$ and $K_3$ are coefficients computed from the performance data set and T is time which is shown on axis 922. The graph in FIG. 3 is taken at temperature $T=T_{characteristic}$ 936. The lifetime $T_{LIFE}$ is defined at the intersection of the performance limit 934 and the fitted curve 925.

Figure 4:
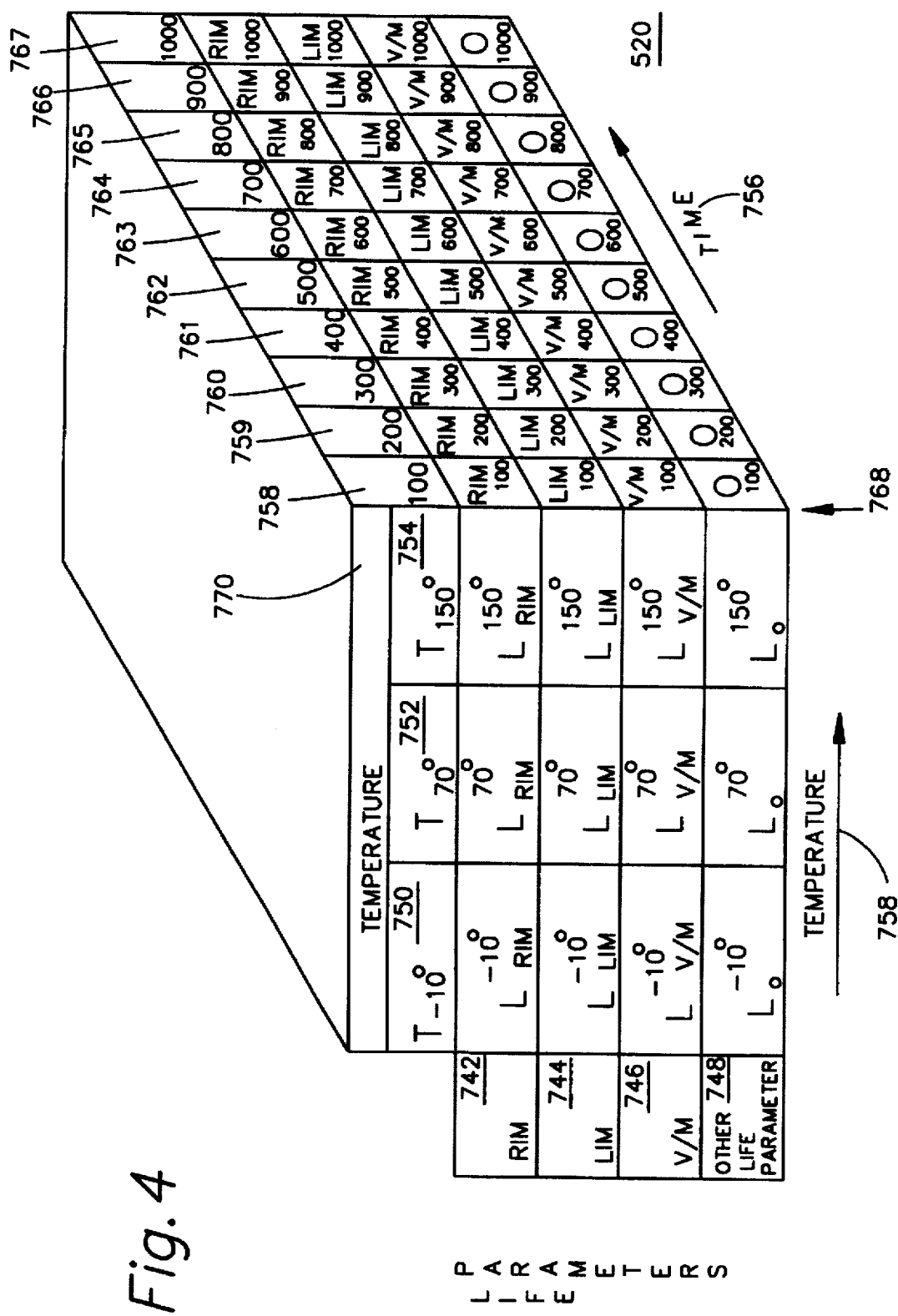
FIG. 4 shows the storage method of the invention showing life parameters versus temperature versus time.

Referring now to FIG. 4 one method of the invention used to store lifetime performance data and estimated life data is illustrated graphically. Those skilled in the art will recognize that for each temperature value there will be a particular lifetime performance chart likened to FIG. 3. In one example embodiment of the invention the three performance characteristics of the laser gyro are known as the readout intensity monitor or RIM the laser intensity monitor or LIM and volts per mode, which is a derived quantity shown with reference to FIG. 2. The laser gyro life parameters can be augmented with another life parameter shown in FIG. 4. The data shown in FIG. 4 is structured in such a way that it can be stored in a non-volatile memory in the modular gyro of FIG. 1.

The structure of the storage of the method of the invention allows the storing of laser gyro lifetime based on a unique algorithm that minimizes the amount of memory required to store the lifetime information and prediction information. FIG. 4 shows a three-dimensional storage method that in one dimension of the three-dimensional storage method has the critical temperatures shown as $T_{10°}$, $T_{70°}$ and $T_{150°}$. The temperatures may advantageously be chosen by the system designer to represent the critical temperatures at which the laser gyro will operate. Those skilled in the art will recognize that these temperatures are by way of example and other temperatures could be used depending on particular laser gyro characteristics. The life parameters are shown as the RIM signal 742, LIM signal 744 and volts per mode 746 and other life parameters 748. These life parameters are used because they have been determined experimentally to be the signals that best represent the performance of the laser gyro over time. FIG. 4 also shows on a third axis time ranges that will be used to store particular laser gyro performance information—time bins. FIG. 4 shows the effect of storing at least ten performance figures over 1000 hour lifetime periods. In this embodiment of the invention the lifetimes are shown as the 100 hours bin, the 200 hours bin, the 300 hours bin, the 400 hours bin, the 500 hours bin, the 600 hours bin, the 700 hours bin, the 800 hours bin, the 900 hours bin and the 1000 hours bin. FIG. 4 shows a life parameter of $RIM_{100}$, $LIM_{100}$, volts per $mode_{100}$ and $other_{100}$ in a column associated with the 100 hours bin. The entire three-dimensional array contains life parameter measurements for various combinations of parameter, critical temperature and lifetime.

Figure 5A:
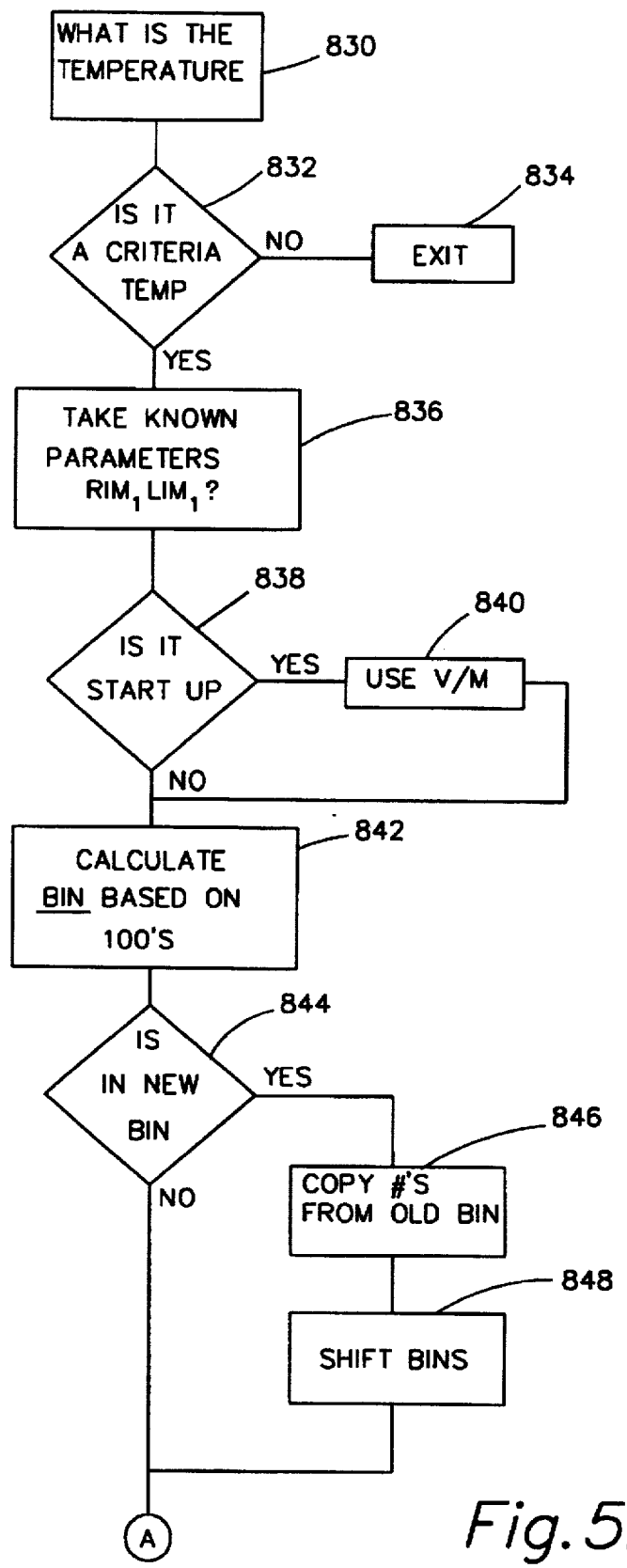
FIGS. 5A and 5B are intended to be pieced together as a single drawing which shows the method of the invention to determine the laser gyro lifetime.
Figure 5B:
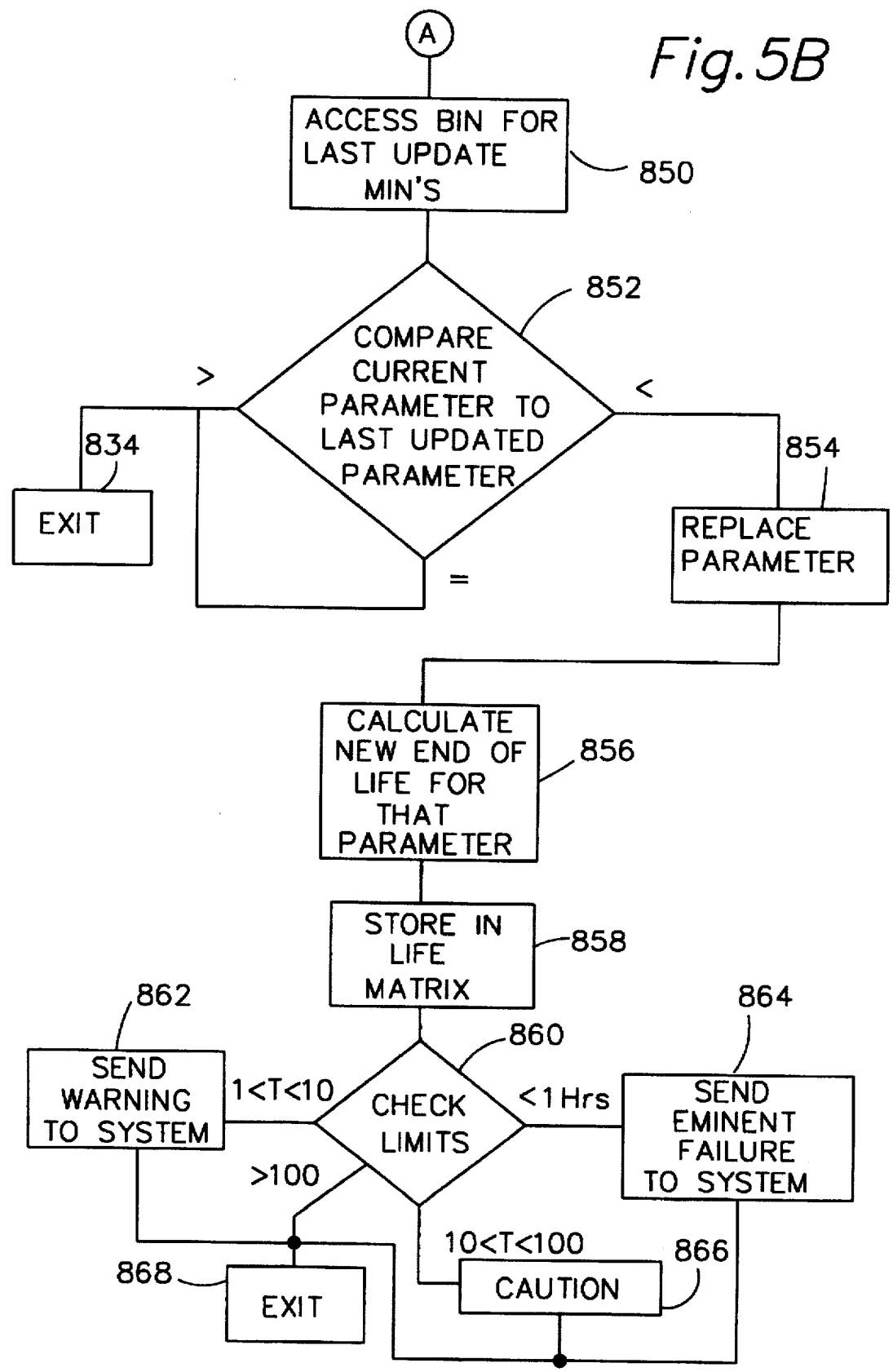

Now referring to FIGS. 5A and 5B which are intended to be pieced together to be read as a single Figure, the method of the invention used to determine life and store information into the memory model of FIG. 4 is shown. The process of FIGS. 5A and 5B is run in one preferred embodiment of the invention at a 1 hz rate for example. Still referring to FIGS. 5A and 5B, the process starts by determining what the laser gyro temperature is in process step 830. The process determines the temperature using the temperature measurement apparatus 33 shown in FIG. 1. The process flows to 832 to determine whether the temperature is a critical temperature.

A critical temperature is determined in one preferred embodiment shown in FIG. 4 as either −10° C., 70° C. or 150° C. Those skilled in the art will recognize that a temperature range may be used advantageously instead of an actual temperature because it is possible that the laser gyro temperature will fluctuate beyond a selected temperature value either before or after the temperature is checked. An example of a range for the −10° temperature would be −8° to −12°, for the 70° temperature range 68° to 72°, and for the 150° temperature range 148° to 152°. This approach allows the determination of a life profile with a larger sample population and presents more life profile data for processing. The process flows to step 834 if the temperature is not in a critical temperature region at which point it returns to the monitor control loop or any lifetime calculation calling process. If the temperature measured is a critical temperature the process flows to step 836 where the RIM, LIM, volts per mode parameters are read from the current system parameter table stored in the memory of the processor 100 shown in FIG. 1.

The process then flows to decision block 838 where the determination is made as to whether or not the laser gyro is being started up. If it is being started up then the volts per mode parameter is also utilized in the method of the invention which is shown in step 840. The volts per mode is only measured on start up in one example of the method of the invention but those skilled in the art will recognize that there are other times that volts per mode could also be used as a lifetime prediction parameter.

In either case the process flows to step 842 to determine which of the lifetime bins will be used as shown in FIG. 4. In the method of FIG. 4 the bins are corresponding to the 100 hour bins shown along the time axis 756. The time of the parameter sample either falls on a bin or it does not. The process then flows to process step 844 to determine whether or not the bin is a new bin. In the example of FIG. 4 it is shown that any hours over 1000 would no longer be in any known bin and that this sample constitutes a candidate for a new bin. Therefore, the new time period must be accommodated for, and the method of the invention allows the accommodation of the new bin by shifting bins. In the shifting bins method of the invention with reference to FIG. 4 the elements of the array for all life parameters that exist in the 200 hour lifetime region is copied to the 100 hour lifetime region 758. Correspondingly, the 300 hour lifetime region 760 is copied to the 200 hour lifetime region 759 and so on until the 1000 hour lifetime region 767 is copied into the 900 lifetime region 766. The regions is relabeled corresponding to region 758 being 200 hours, now 766 being 1000 hours, and 767 being 1100 hours etc. Those skilled in the art will recognize that a pointer to each bin may be defined. Each bin pointer may then be rotated to conserve EEPROM lifetime.

The process flows from the shifting bin step 848 to a 850 where the last bin is accessed for the last life parameter stored in the bin. In decision step 844 a non new bin causes the process flows to step 850. The last updated minimum is the life parameter that is stored in the bin. This means that a life parameter will only be stored in a bin if it does not exceed a currently stored performance parameter. For example if in the 100 hour lifetime region 758 the volts per mode was 1 volts per mode and now it is 0.9 volts per mode, the bin would be updated with 0.9 volts per mode. For example, in the process of FIGS. 5A and 5B the process goes to step 852 where the current parameter is compared to the last updated parameter in the memory model in FIG. 4. If the current parameter is greater than the last updated parameter the process flows to 834 to exit to the monitor control loop. If the current parameter is equal to the last updated parameter then the process similarly exits to the monitor control loop at step 834. If the current parameter is less than the last updated parameter then the process flows to step 854 where the bin parameter is replaced in the new bin. The process then flows to step 856 where the new life expectancy is calculated for the set of parameters that are now updated. The set of parameters will correspond to a new lifetime which will then be updated in the lifetime matrix 770 shown as the face of the cube. The new parameter would be calculated according to a linear quadratic fit or other curve fit that is well known in the art and is stored in the life matrix 770. The process flows from step 858 to 860 where the lifetime limits are checked. This is a part of the lifetime update and prediction algorithm that provides the warning or caution signals to the inertial navigation system using the invention.

The time limits are predetermined considering the mission of the laser gyro. In one example embodiment the critical temperatures used would be at a the one hour mark, ten hour mark and 100 hour mark. If the lifetime predicted by the new parameter is less than one hour then the process flows to step 864 where the method of the invention sends an eminent failure warning to the inertial navigation system in an aircraft, for example. If the lifetime predicted by fitting the new parameter is between one hour and ten hours a warning is sent to the inertial navigation system in step 862 to warn the inertial navigation system operator that the gyro is predicted to be failing and corrective action should be taken, as for example, delaying take off or scheduling a replacement of the gyro upon landing in the case of an airborne unit. The process flows to step 868 if the time left is between ten hours and 100 hours. The process will flash a caution to the inertial navigation system warning that the gyro is close to eminent failure. Otherwise if the lifetime is greater than 100 hours the process flows to 868 and exits back to the monitor control loop.

Figure 6:
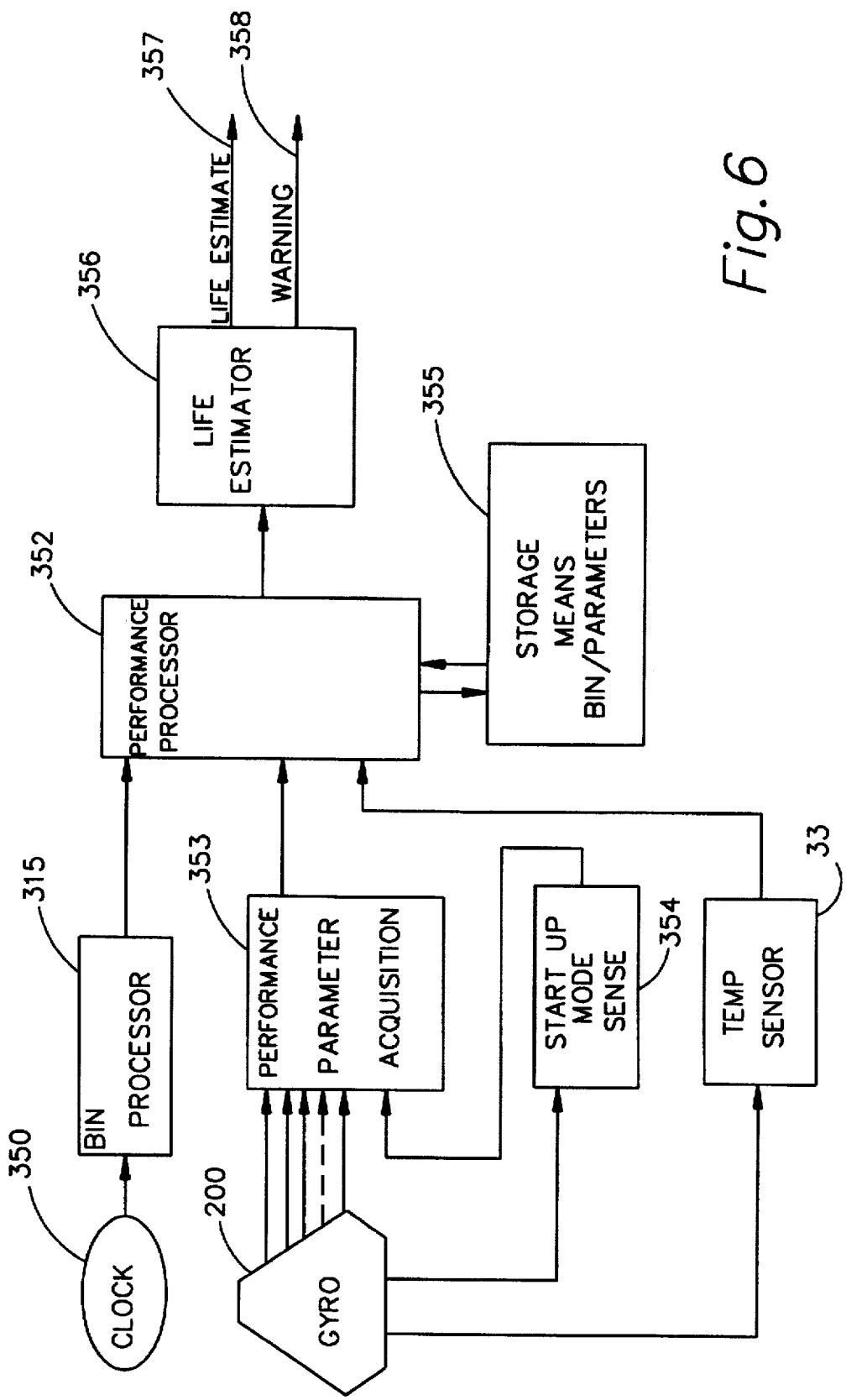
FIG. 6 is a block diagram which shows the laser gyro life prediction apparatus of the invention using a performance processor.

Now referring to FIG. 6 which shows the laser gyro life prediction apparatus of the invention using a performance processor. A real time clock 350 feeds the time of day to a bin processor 351. The bin processor selects the proper bin based on the time and the predetermined bin designation. The laser gyro 200 feeds a set of performance parameter such as the RIM, LIM and volts per mode signal to a performance parameter acquisition system 353. The performance parameter acquisition system provides a performance processor with required performance parameters. Start up mode sensor 354 determines whether the laser gyro is in start up mode and provides other performance parameters to the parameter performance acquisition system 353. Temperature sensor 33 monitors the gyro 200 temperature and provides the performance processor 352 with the current temperature. The performance processor 352 executes the methods described above in computing the correct bin performance parameter and temperature range for storage in the data structure stored in storage means 355. Performance processor 352 then provides the life estimator 356 with the current parameters for each bin in question. The life estimator 356 then provides a life estimate 357 and a warning 358 to an external system.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A lifetime predicting laser gyro apparatus comprising:
   (a) laser gyro means having at least one parameter of performance; and
   (b) means for predicting when the laser gyro means will fail based on the at least one parameter of performance.

2. The lifetime predicting laser gyro apparatus of claim 1 wherein the at least one parameter of performance comprises a read out intensity monitor parameter.

3. The lifetime predicting laser gyro apparatus of claim 1 wherein the at least one parameter of performance comprises a laser intensity monitor parameter.

4. The lifetime predicting laser gyro apparatus of claim 1 wherein the at least one parameter of performance comprises a volts/mode monitor parameter.

5. A lifetime prediction apparatus for a laser gyro including a laser gyro block, a lasing means, at least one performance parameter and at least one predetermined failure limit, the lifetime prediction apparatus comprising:
   (a) a temperature measurement means for measuring a laser gyro temperature having a sensing input connected to the laser gyro block and having a block temperature output;
   (b) means for measuring volts per mode connected to the lasing means having a volts per mode performance parameter output;
   (c) performance processing means for determining a critical temperature having an input for receiving the block temperature output and the volts per mode performance parameter output, and having a performance parameter output and a performance data output;
   (d) a storage means connected to the performance parameter output; and
   (e) functional estimation means for calculating a gyro end of life based on a predetermined functional estimation, connected to the performance data output.

6. The lifetime prediction apparatus of claim 5 wherein the laser gyro has a laser gyro lifetime, the lifetime prediction apparatus further including a life estimation means for determining the laser gyro lifetime, the lifetime estimation means connected to the functional estimation means and having a lifetime output.

7. The lifetime prediction apparatus of claim 6 further comprising a warning means for determining if the laser gyro lifetime is less than a predetermined amount of time, the warning means being integral to the lifetime output and having a warning output.

8. The lifetime prediction apparatus of claim 5 wherein the storage means further comprises a plurality of bins.

9. The lifetime prediction apparatus of claim 8 wherein:
   (a) the storage means further comprises a last performance parameter bin for storing a last performance parameter and a current performance parameter bin for storing a current performance parameter; and
   (b) a means coupled to the storage means for comparing the last performance parameter data to the current performance parameter so as to determine whether to replace the last performance parameter with the current parameter in the storage means.

10. The lifetime prediction apparatus of claim 8 where the laser gyro lifetime is measured over a predetermined temperature range and wherein the storage means further comprises a predetermined number of bins spanning the predetermined temperature range and includes a top bin and a bottom bin.

11. The lifetime prediction apparatus of claim 8 wherein the laser gyro has a current run time the apparatus further comprising a new bin determining means for calculating a bin number for a performance parameter sample at the current time, the new bin determining means connected at a run time input to receive the current run time, and having an output coupled to the performance processor means so as to calculate the bin number for the performance parameter sample data at the current time based on the current time and to cooperate with the performance processor means shift all elements of the plurality of bins down to a lower bin such that the oldest data is eliminated and the new data is put in the top bin.

12. The lifetime prediction apparatus of claim 5 wherein the predetermined functional estimation comprises a linear fit curve.

13. The lifetime prediction apparatus of claim 5 wherein the predetermined functional estimation comprises a quadratic fit curve.

14. The lifetime prediction apparatus of claim 5 wherein the predetermined functional estimation comprises a higher order polynomial fit curve.

15. The lifetime prediction apparatus of claim 6 wherein the warning means further comprises at least three levels of warning comprising:
   (a) if the life is less than ten hours, an imminent failure warning;
   (b) if the life is between ten hours and 100 hours, a close to failure warning; and
   (c) if the life is between 100 hours and 1000 hours, a caution and indication of needed maintenance warning.

16. The lifetime prediction apparatus of claim 5 wherein the functional estimation means for calculating a gyro end of life means comprises a microprocessor.

17. The lifetime prediction apparatus of claim 5 wherein the life estimation means further comprises a microprocessor.

18. The lifetime prediction apparatus of claim 5 wherein the at least one laser gyro performance parameter comprises a read out intensity monitor parameter.

19. The lifetime prediction apparatus of claim 5 wherein the at least one laser gyro performance parameter comprises a laser intensity monitor parameter.

20. The lifetime prediction apparatus of claim 5 wherein the at least one laser gyro performance parameter further comprises a volts/mode monitor parameter.

21. A lifetime prediction method for a laser gyro including at least one performance parameter and at least one predetermined failure limit comprising the steps of:
   (a) creating a memory model of the performance of a performance parameter constituting a three-dimensional array of temperature parameters and lifetime where the lifetime is measured over a predetermined range and within the range there is a predetermined number of bins having a top bin and a bottom bin wherein the predetermined number of bins exists for each temperature;
   (b) measuring the temperature of the laser gyro;
   (c) determining whether the temperature is a critical temperature and if it is a critical temperature executing the following steps;
   (d) accessing the performance parameter for the laser gyro;
   (e) determining whether the laser gyro is in the start up mode and if it is enabling the use of a volts per mode parameter;
   (f) calculating a bin number based on the current time;
   (g) determining if the bin is a new bin not already in the memory model and if it is shifting all elements of the bin down to a lower bin so that the oldest data is eliminated and the new data is put in the top bin;
   (h) accessing the bin at this time period for the last performance data;
   (i) comparing the last performance data to the current parameter and if it is greater than or equal to the currently stored parameter then not executing the next step;
   (j) replacing the parameter if it is less than the current parameter;
   (k) calculating a new end of life based on a predetermined fit of the life data in the memory model;
   (l) storing the life data in the life matrix at that time and temperature;
   (m) determining the life as being the estimated life minus the current time;
   (n) if the life is less than ten hours indicating an eminent failure;
   (o) if the life is between ten hours and 100 hours indicating a warning; and
   (p) if the life is between 100 hours and 1000 hours indicating a caution and indication of needed maintenance.

22. The lifetime prediction apparatus of claim 21 wherein the predetermined fit comprises a linear fit.

23. The lifetime prediction apparatus of claim 21 wherein the predetermined fit comprises a quadratic fit.

24. The lifetime prediction apparatus of claim 21 wherein the predetermined fit comprises a higher order polynomial fit.

25. The lifetime prediction apparatus of claim 21 wherein the warning means further comprises three levels of warning comprising:
   (a) if the life is less than ten hours, an eminent failure warning;
   (b) if the life is between ten hours and 100 hours, close to failure warning; and
   (c) if the life is between 100 hours and 1000 hours, a caution and indication of needed maintenance warning.

* * * * *